(12) United States Patent
Devine et al.

(10) Patent No.: US 11,349,234 B2
(45) Date of Patent: May 31, 2022

(54) SURFACE MOUNT ELECTRICAL CONNECTOR

(71) Applicants: TE Connectivity Services GmbH, Schaffhausen (CH); Tyco Electronics (Shanghai) Co., Ltd., Shanghai (CN)

(72) Inventors: Christopher P. Devine, Cedar Park, TX (US); Hua Li, Shanghai (CN); Wenke He, Shanghai (CN); Wanfa Su, Shanghai (CN)

(73) Assignees: TE CONNECTIVITY SERVICES GmbH, Schaffhausen (CH); TYCO ELECTRONICS (SHANGHAI) CO. LTD., Shanghai (CN)

( * ) Notice: Subject to any disclaimer, the term of this patent is extended or adjusted under 35 U.S.C. 154(b) by 17 days.

(21) Appl. No.: 16/877,900

(22) Filed: May 19, 2020

(65) Prior Publication Data
US 2021/0313722 A1    Oct. 7, 2021

(51) Int. Cl.
| H01R 13/713 | (2006.01) |
| H01R 12/71 | (2011.01) |
| H01G 2/06 | (2006.01) |
| H05K 3/34 | (2006.01) |
| H01R 12/70 | (2011.01) |
| H01R 12/55 | (2011.01) |

(52) U.S. Cl.
CPC ............ *H01R 12/714* (2013.01); *H01G 2/06* (2013.01); *H01R 12/55* (2013.01); *H01R 12/7005* (2013.01); *H01R 12/716* (2013.01); *H05K 3/3421* (2013.01)

(58) Field of Classification Search
CPC .... H01R 12/714; H01R 12/55; H01R 12/716; H01R 12/7005; H05K 3/3421; H01G 2/06
USPC .......................................................... 439/83
See application file for complete search history.

(56) References Cited

U.S. PATENT DOCUMENTS

| 6,206,719 | B1 | 3/2001 | Tsunezawa et al. | |
| 6,530,804 | B1 * | 3/2003 | Wu ..................... | H01R 13/2442 439/500 |
| 7,400,239 | B2 * | 7/2008 | Kiko ...................... | H01H 9/52 340/501 |
| 9,806,437 | B2 * | 10/2017 | Scanzillo ............. | H01R 4/4818 |
| 9,843,144 | B2 * | 12/2017 | Mortun ................. | H01R 24/62 |
| 10,395,871 | B1 * | 8/2019 | Salas ................... | H01H 71/0207 |
| 10,770,843 | B1 * | 9/2020 | Zhang ................... | H01R 31/06 |

(Continued)

FOREIGN PATENT DOCUMENTS

CN          102789887 A     11/2012

*Primary Examiner* — Abdullah A Riyami
*Assistant Examiner* — Nelson R. Burgos-Guntin

(57) ABSTRACT

An electrical connector includes a housing having contact chambers between a top and a bottom configured to be mounted to a circuit board. A rear wall of the housing includes lead slots open at the top to receive leads of an electrical component. The electrical connector includes a cover coupled to the top of the housing above the leads. The electrical connector includes contacts received in corresponding contact chambers. Each contact includes a base having a solder pad at a bottom configured to be soldered to a circuit board conductor of the circuit board. Each contact includes contact beams extending from the base to form a socket proximate to the top of the housing that receives the lead of the electrical component from above to electrically connect to the lead of the electrical component.

21 Claims, 7 Drawing Sheets

(56) References Cited

U.S. PATENT DOCUMENTS

| | | | |
|---|---|---|---|
| 10,965,049 B2* | 3/2021 | Byrne | H02G 3/18 |
| 2004/0147148 A1* | 7/2004 | Ng | H01R 13/4534 |
| | | | 439/137 |
| 2007/0190813 A1* | 8/2007 | Okada | H01R 13/4532 |
| | | | 439/34 |
| 2008/0068816 A1* | 3/2008 | Han | H05K 3/308 |
| | | | 361/760 |
| 2012/0061369 A1* | 3/2012 | Gu | G05D 23/1928 |
| | | | 219/209 |
| 2013/0280956 A1* | 10/2013 | Cheng | H01R 25/006 |
| | | | 439/620.15 |
| 2016/0149354 A1* | 5/2016 | Mortun | H01R 25/006 |
| | | | 439/620.21 |
| 2017/0063008 A1* | 3/2017 | Goyal | H01R 13/6675 |

\* cited by examiner

SURFACE MOUNT ELECTRICAL CONNECTOR

CROSS REFERENCE TO RELATED APPLICATIONS

This application claims benefit to Chinese Application No. 202010257044.8, filed 2 Apr. 2020, the subject matter of which is herein incorporated by reference in its entirety.

BACKGROUND OF THE INVENTION

The subject matter herein relates generally to electrical connectors for electrical components.

Electrical components, such as capacitors, LEDs, relays and other powered devices, provided in electrical systems are powered by electrical connection to power circuits of a circuit board. For example, positive and negative leads of the electrical components are soldered to positive and negative conductors of the circuit board. However, removal and replacement of such electrical components is difficult and may damage the electrical component and/or the circuit board. Additionally, the solder joints between the leads of the electrical components may be damaged or break over time, such as due to movement of the electrical component relative to the circuit board.

A need remains for an electrical connection that may provide a reliable electrical connection between an electrical component and a circuit board.

BRIEF DESCRIPTION OF THE INVENTION

In one embodiment, an electrical connector is provided. The electrical connector includes a housing having walls forming contact chambers. The housing has a top and a bottom. The bottom is configured to be mounted to a circuit board. The walls of the housing include a front wall and a rear wall. The rear wall includes lead slots open at the top to receive leads of an electrical component. The electrical connector includes a cover coupled to the top of the housing. The cover includes lead guide tabs configured to engage the leads of the electrical component to push the leads downward in the lead slots as the cover is coupled to the top of the housing. The electrical connector includes contacts received in corresponding contact chambers. Each contact includes a base provided at the bottom of the housing. The base has a solder pad at a bottom of the base configured to be soldered to a circuit board conductor of the circuit board. Each contact includes contact beams extending from the base to form a socket proximate to the top of the housing. The socket is configured to receive the lead of the electrical component from above to electrically connect to the lead of the electrical component.

In another embodiment, an electrical connector is provided. The electrical connector includes a housing having walls forming a positive contact chamber and a negative contact chamber. The housing has a top and a bottom. The bottom is configured to be mounted to a circuit board. The walls of the housing include a front wall and a rear wall. The rear wall includes a positive lead slot open at the top and aligned with the positive contact chamber to receive a positive lead of the electrical component and a negative lead slot open at the top and aligned with the negative contact chamber to receive a negative lead of the electrical component. The electrical connector includes a cover coupled to the top of the housing. The cover includes lead guide tabs configured to engage the positive lead and the negative lead to push the positive lead downward into the positive lead slot and to push the negative lead downward in the negative lead slot as the cover is coupled to the top of the housing. The electrical connector includes a positive contact received in the positive contact chamber. The positive contact includes a positive base provided at the bottom of the housing. The positive base has a positive solder pad at a bottom of the positive base configured to be soldered to a positive circuit board conductor of the circuit board. The positive contact includes positive contact beams extending from the positive base to form a positive socket proximate to the top of the housing. The positive socket is configured to receive the positive lead of the electrical component from above to electrically connect to the positive lead of the electrical component. The electrical connector includes a negative contact received in the negative contact chamber. The negative contact includes a negative base provided at the bottom of the housing. The negative base has a negative solder pad at a bottom of the negative base configured to be soldered to a negative circuit board conductor of the circuit board. The negative contact includes negative contact beams extending from the negative base to form a negative socket proximate to the top of the housing. The negative socket is configured to receive the negative lead of the electrical component from above to electrically connect to the negative lead of the electrical component.

In a further embodiment, a power circuit assembly is provided. The power circuit assembly includes a circuit board having board contacts on an upper surface of the circuit board. The power circuit assembly includes a radial lead electrical component having radially extending leads extending from a first side of the radial lead electrical component. An electrical connector is surface mounted to the upper surface of the circuit board to electrically connect the leads of the radial lead electrical component to the board contacts of the circuit board, the electrical connector comprising. The power circuit assembly includes a housing having walls forming contact chambers. The housing has a top and a bottom. The bottom is configured to be mounted to a circuit board. The walls of the housing include a front wall and a rear wall. The rear wall includes lead slots open at the top to receive leads of an electrical component. The power circuit assembly includes a cover coupled to the top of the housing. The cover includes lead guide tabs configured to engage the leads of the electrical component to push the leads downward in the lead slots as the cover is coupled to the top of the housing. The power circuit assembly includes contacts received in corresponding contact chambers. Each contact includes a base provided at the bottom of the housing. The base has a solder pad at a bottom of the base configured to be soldered to a circuit board conductor of the circuit board. Each contact includes contact beams extending from the base to form a socket proximate to the top of the housing. The socket is configured to receive the lead of the electrical component from above to electrically connect to the lead of the electrical component.

DETAILED DESCRIPTION OF THE INVENTION

Figure 1:
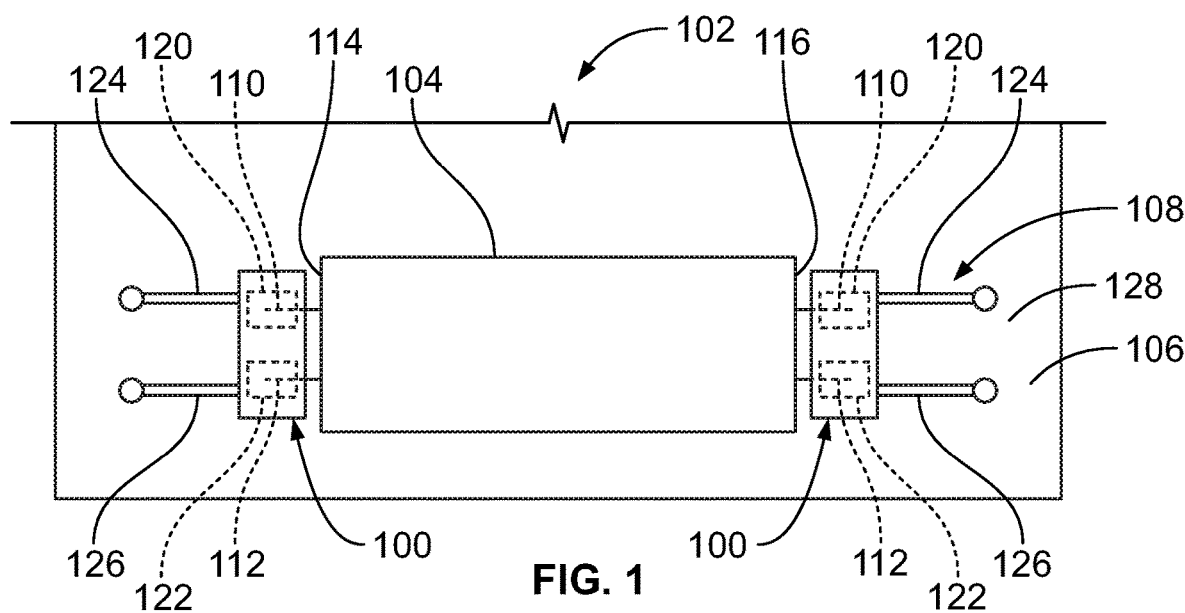
FIG. 1 is a schematic view of an electrical connector for a power circuit assembly in accordance with an exemplary embodiment.

FIG. 1 is a schematic view of an electrical connector 100 for a power circuit assembly 102 in accordance with an exemplary embodiment. The power circuit assembly 102 includes a radial lead electrical component 104 and a circuit board 106. The electrical connectors 100 are provided at opposite ends of the radial lead electrical component 104 to electrically connect the radial lead electrical component 104 to a power circuit 108 of the circuit board 106. In various embodiments, the radial lead electrical component 104 may be a capacitor; however, the radial lead electrical component 104 may be another type of electrical component, such as an LED, a relay, or another type of powered electrical device coupled to the power circuit 108.

In an exemplary embodiment, the electrical connectors 100 are surface mount electrical connectors configured to be surface mounted to the circuit board 106. The electrical connectors 100 are electrically connected to radially extending leads 110, 112 extending from opposite first and second sides 114, 116 of the radial lead electrical component 104. The leads 110, 112 are a positive lead 110 and a negative lead 112 extending from each side 114, 116. In other various embodiments, the radial lead electrical component 104 may include leads 110, 112 extending from a single side. The leads 110, 112 may be poked into the electrical connectors 100 for quick connection and disconnection from the electrical connectors 100 without damaging the leads 110, 112. For example, the leads 110, 112 may be electrically connected to the electrical connectors 100 at separable mating interfaces. The leads 110, 112 may be electrically connected to the electrical connectors 100 without soldering the leads 110, 112 to the contact of the electrical connectors 100.

In an exemplary embodiment, the electrical connectors 100 are identical such that the same electrical connector 100 may be coupled to either side, which reduces part count. For example, the electrical connectors 100 may be reversible for mounting to the opposite sides 114, 116. In an exemplary embodiment, each electrical connector 100 includes a first contact 120 and a second contact 122. The first contact 120 may be a positive contact configured to be electrically connected to a positive circuit board conductor 124 and the second contact 122 may be a negative contact configured to be electrically connected to a negative circuit board conductor 126. In an exemplary embodiment, the first contact 120 is surface mounted to the circuit board conductor 124 and the second contact 122 is surface mounted to the circuit board conductor 126. For example, the first and second contacts 120, 122 may be soldered to the circuit board conductors 124, 126 and an upper surface 128 of the circuit board 106. The circuit board conductors 124 may include pads, traces, vias, or other circuits of the circuit board 106. The circuit board conductors 124, 126 may be routed to other locations or components on the circuit board 106.

Figure 2:
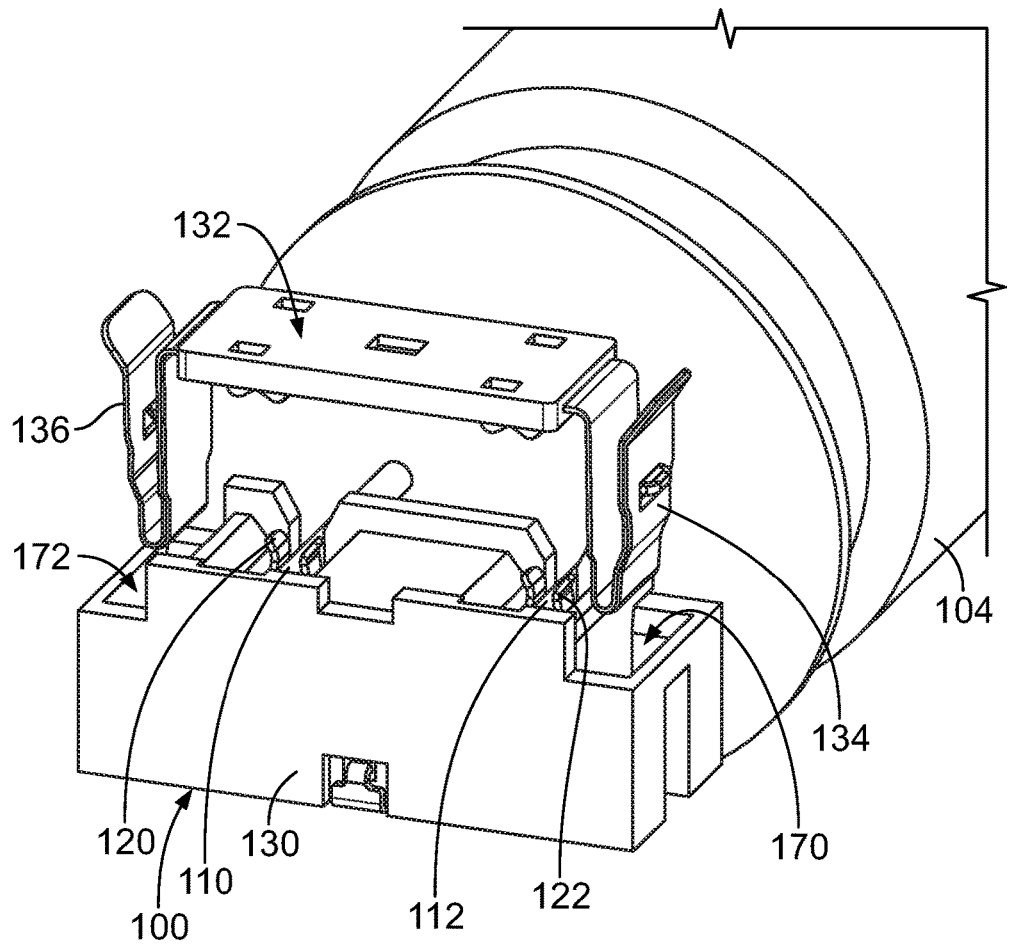
FIG. 2 is a front perspective, partially exploded view of the electrical connector in accordance with an exemplary embodiment.

FIG. 2 is a front perspective, partially exploded view of the electrical connector 100 coupled to the radial lead electrical component 104 in accordance with an exemplary embodiment. The electrical connector 100 includes a housing 130 holding the contacts 120, 122 and a cover 132 configured to be coupled to the housing 130. In an exemplary embodiment, the cover 132 includes first and second latches 134, 136 used to latchably couple the cover 132 to the housing 130. The latches 134, 136 are releasable to remove the cover 132 from the housing 130. The contacts 120, 122 are arranged in the housing 130 for electrical connection with the leads 110, 112 of the radial lead electrical component 104. For example, the contacts 120, 122 are received in corresponding contact chambers 170, 172, which receive the leads 110, 112 to electrically connect the leads 110, 112 with the contacts 120, 122, respectively. In an exemplary embodiment, the leads 110, 112 are mated with the contacts 120, 122 from above.

Figure 3:
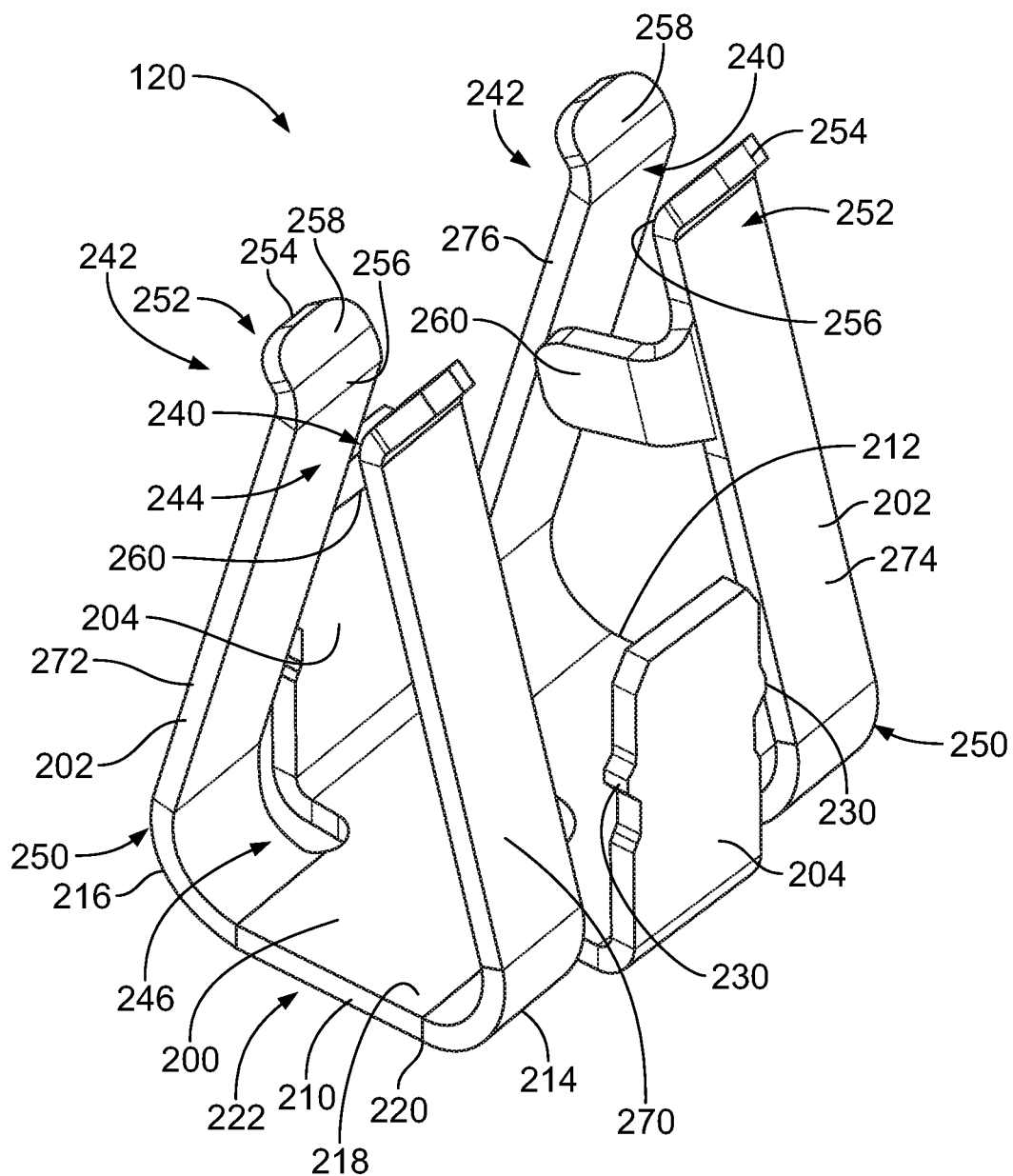
FIG. 3 is a front perspective view of a contact of the electrical connector in accordance with an exemplary embodiment.
Figure 4:
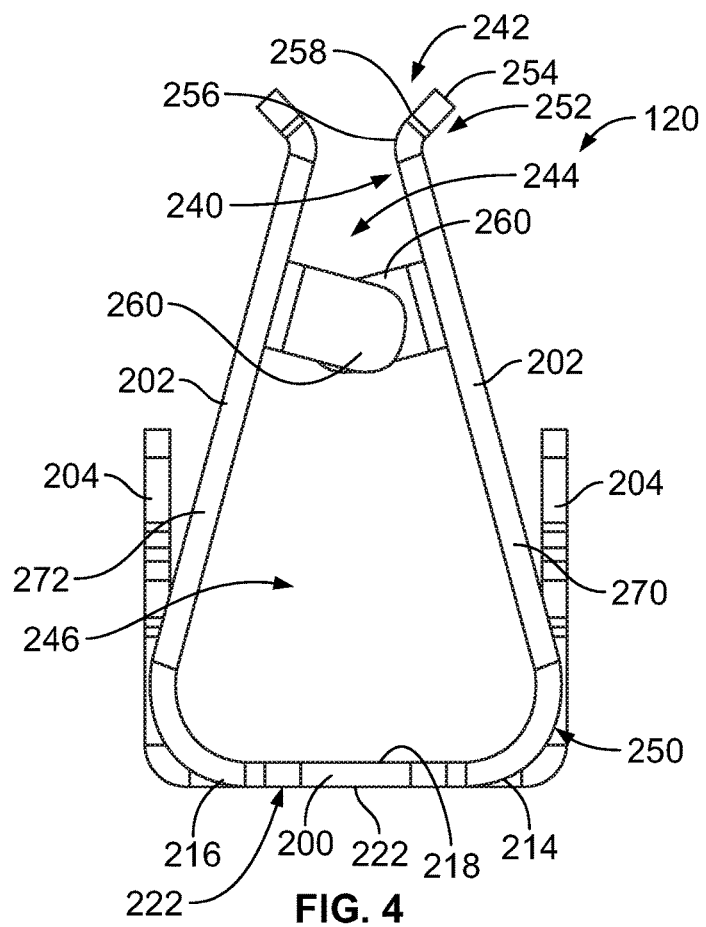
FIG. 4 is a front view of the contact in accordance with an exemplary embodiment.

FIG. 3 is a front perspective view of the contact 120 in accordance with an exemplary embodiment. FIG. 4 is a front view of the contact 120 in accordance with an exemplary embodiment. The contact 120 may be identical to the contact 122 (shown in FIG. 2). The contact 120 includes a base 200, contact beams 202 extending from the base 200, and the mounting tabs 204 extending from the base 200. In an exemplary embodiment, the contact 120 is a stamped and formed contact. The base 200, the contact beams 202 and the mounting tabs 204 are stamped from a single sheet of metal with the contact beams 202 and the mounting tabs 204 being bent and formed into the contact structure.

The base 200 extends between a front 210 and a rear 212. The base 200 includes first and second sides 214, 216 extending between the front 210 and the rear 212. The base 200 includes a top 218 and a bottom 220 opposite the top 218. The bottom 220 is configured to face the circuit board 106 (shown in FIG. 1). The bottom 220 defines a solder pad 222 configured to be soldered to the corresponding circuit board conductor 124 (shown in FIG. 1). In an exemplary embodiment, the base 200 is planar having a top 218 parallel to the bottom 220. Other shapes are possible in alternative embodiments. In various embodiments, the contact 120 may include protrusions, tabs, pins, and the like extending from the bottom 220, such as for electrical connection with the circuit board 106. In various alternative embodiments, the contact 120 may include one or more press-fit pins extending from the bottom 220 configured to be press-fit into plated vias of the circuit board 106.

The mounting tabs 204 extend from the base 200 for connection to the housing 130 (shown in FIG. 2). For example, the mounting tabs 204 may be pressed into the housing 130 to mechanically secure the contact 120 to the housing 130. In an exemplary embodiment, the mounting tab 204 includes barbs 230 extending from the edges configured to dig into the plastic material of the housing 130 to retain the mounting tab 204 in the housing 130. Other types of retaining features may be used in alternative embodiments, such as a lance being stamped out of the mounting tab 204 configured to dig into the housing 130 or snap into a pocket within the housing 130. In the illustrated embodiment, the contact 120 includes a pair of mounting tabs 204 extending from the opposite sides 214, 216 of the base 200. The mounting tabs 204 are approximately centered between the front 210 and the rear 212 of the base 200. Other locations are possible in alternative embodiments. Greater or fewer mounting tabs 204 may be provided in alternative embodiments.

In an exemplary embodiment, the contact 120 includes a plurality of the contact beams 202 extending from the base 200. Each contact beam 202 includes at least one mating interface 240 configured to be electrically connected to the lead 110. As such, the contact 120 includes multiple points of contact with the lead 110. In an exemplary embodiment, the contact beams 202 are spring beams configured to be spring biased against the lead 110 with a spring force to maintain mechanical and electrical connection with the lead 110. For example, the contact beams 202 may be cantilevered from the base 200 and displaced or deflected outward when mated with the lead 110. The deflection causes the contact beams 202 to elastically deform creating an internal spring biasing force in an inward direction to press the contact beams 202 against the leads 110 to electrically connect the contact 120 to the lead 110.

In an exemplary embodiment, the contact beams 202 are arranged in contact pairs 242 extending from the opposite sides 214, 216 of the base 200. Each contact pair 242 forms a socket 244 that receives the lead 110 in a contact space 246 defined between the contact beams 202 of the contact pair 242. The contact beams 202 are configured to engage the lead 110 on opposite sides of the socket 244. The contact beams 202 are configured to retain the lead 110 within the socket 244.

Each contact beam 202 extends between a proximal end 250 and a distal end 252. The contact beam 202 includes a mating tip 254 at the distal end 252. The mating tip 254 is configured to engage the lead 110 at the separable mating interface 240. In an exemplary embodiment, each contact beam 202 includes an inwardly extending knuckle 256 at the distal end 252. The mating interface 240 is defined at the knuckle 256, such as at or near the apex of the knuckle 256. In an exemplary embodiment, the contact beam 202 is flared outward at the distal end 252 between the knuckle 256 and the mating tip 254. The contact beam 202 includes a guide surface 258 at the distal end 252 used to guide the lead 110 into the socket 244. For example, the guide surfaces 258 are angled to form a larger catch window for the lead 110 to guide the lead 110 into the socket 244. For example, a separation distance across the contact space 246 between the mating tips 254 of the contact pair 242 is wider than a separation distance across the contact space 246 between the knuckles 256 of the contact pair 242. In an exemplary embodiment, the contact beam 202 may be generally planar between the proximal end 250 and the distal ends 252 (for example, to the knuckle 256 at the distal end 252, prior to being flared out to form the guide surface 258).

In an exemplary embodiment, one or more of the contact beams 202 includes a lead support tab 260 extending into the contact space 246. The lead support tab 260 defines a bottom of the socket 244. The lead support tab 260 is configured to support the lead 110 in the socket 244. In the illustrated embodiment, the lead support tab 260 is located below the knuckle 256. The distance between the lead support tab 260 and the knuckle 256 may be based on a diameter of the lead 110. The lead support tab to 60 may extend from the front edge and/or the rear edge of the contact beam 202.

In an exemplary embodiment, the contact beams 202 of the contact pair 242 include a first contact beam 270 and a second contact beam 272. The first contact beam 270 extends from the first side 214 of the base 200 and the second contact beam 272 extends from the second side 216 of the base 200. The socket 244 is defined between the first and second contact beams 270, 272. The first contact beam 270 may include a lead support tab 260 extending toward the second contact beam 272 and/or the second contact beam 272 may include a lead support tab 260 extending toward the first contact beam 270. In an exemplary embodiment, the first and second contact beams 270, 272 are non-parallel to each other. For example, the first contact beam 270 is non-perpendicular to the base 200 and the second contact beam 272 is non-perpendicular to the base 200. In an exemplary embodiment, the first contact beam 270 is pitched toward the second contact beam 272 and the second contact beam 272 is pitched toward the first contact beam 270. For example, the first contact beam 270 may be pitched at a pitch angle between approximately +10° and +30° (from the vertical axis) and the second contact beam 270 may be pitched at a pitch angle between approximately −10° and −30° (from the vertical axis). As such, the distal ends 252 of the contact beams 270, 272 may be closer than the proximal ends 250. In various embodiments, the knuckles 256 of the contact beams 270, 272 may be positioned adjacent each other such that the knuckles 256 approximately touch each other.

In an exemplary embodiment, the contact 120 includes contact pairs 242 located at both the front and the rear of the contact 120. The first contact beam 270 defines a first front contact beam extending from the first side 214 of the base 200 proximate to the front 210 of the base 200. The second contact beam 272 defines a second front contact beam extending from the second side 216 of the base 200 proximate to the front 210 of the base 200. The contact beams 202 include a first rear contact beam 274 and a second rear contact beam 276. The first rear contact beam 274 extends from the first side 214 of the base 200 proximate to the rear 212 of the base 200. The second rear contact beam 276 extends from the second side 216 of the base 200 proximate to the rear 212 of the base 200. The mounting tabs 204 are located between the front and rear contact pairs 242. The contact 120 may include greater or fewer contact beams 202 in alternative embodiments.

Figure 6:
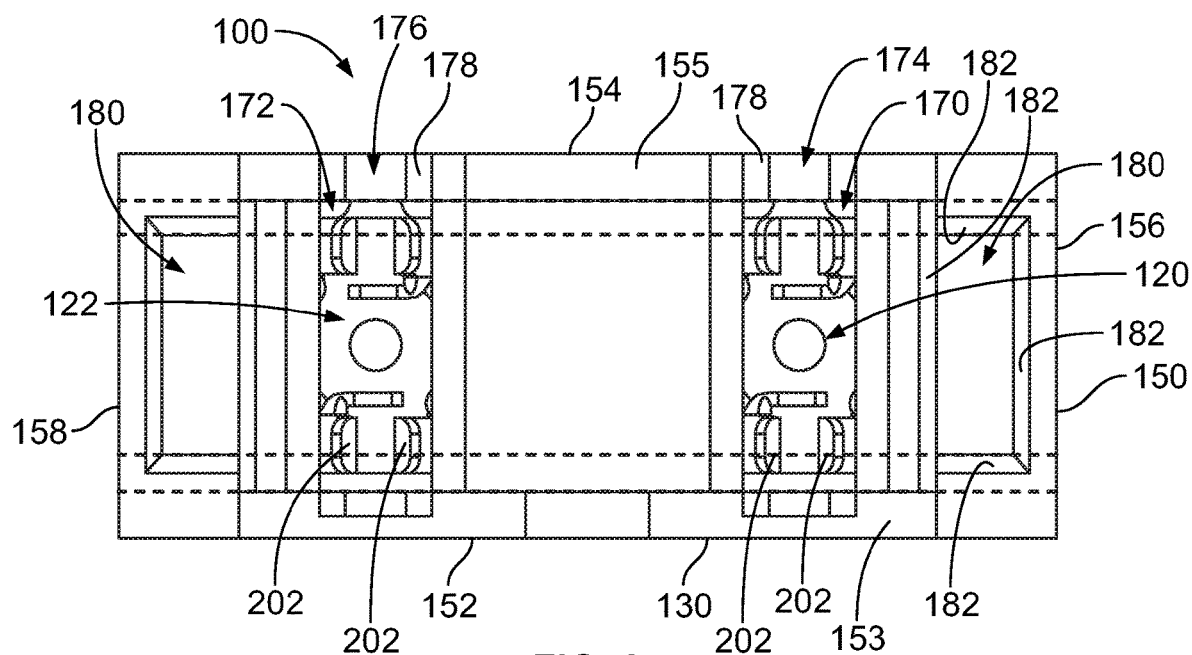
FIG. 6 is a top view of a portion of the electrical connector in accordance with an exemplary embodiment.
Figure 5:
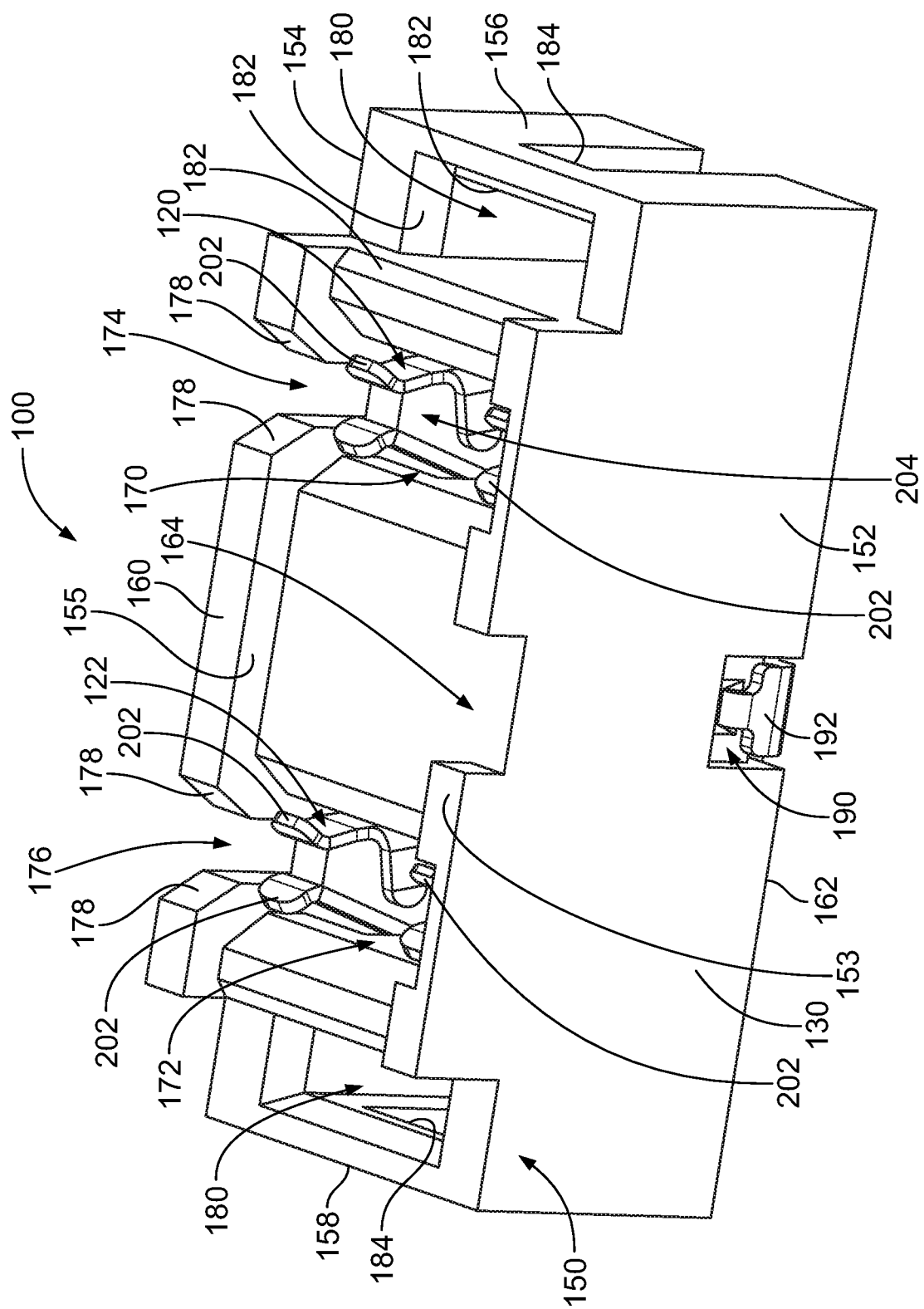
FIG. 5 is a front, top perspective view of a portion of the electrical connector in accordance with an exemplary embodiment.
Figure 7:
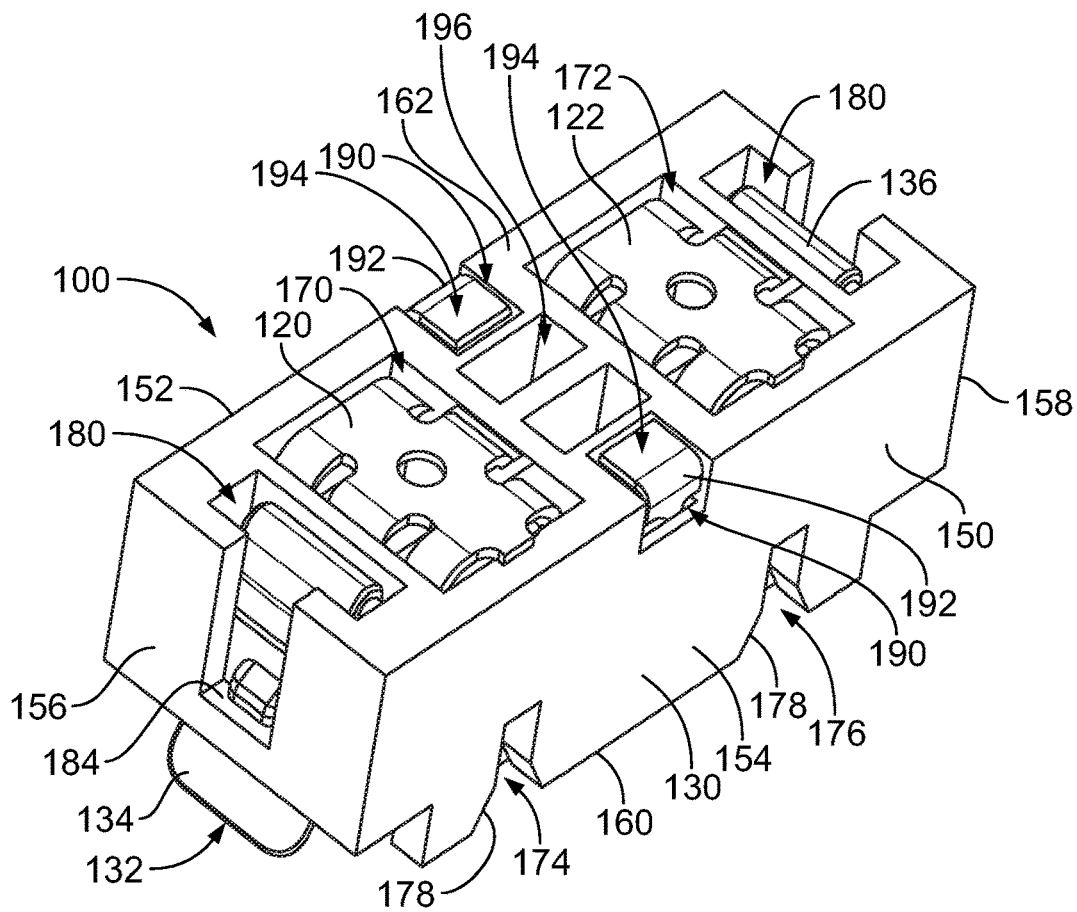
FIG. 7 is a rear, bottom perspective view of a portion of the electrical connector in accordance with an exemplary embodiment.

FIG. 5 is a front, top perspective view of a portion of the electrical connector 100 in accordance with an exemplary embodiment. FIG. 6 is a top view of a portion of the electrical connector 100 in accordance with an exemplary embodiment. FIG. 7 is a rear, bottom perspective view of a portion of the electrical connector 100 in accordance with an exemplary embodiment. FIGS. 5-7 illustrate the contacts 120, 122 received in the housing 130. FIG. 7 illustrates the cover 132 coupled to the housing 130; however, FIGS. 5-6 have the cover 132 removed to illustrate the contacts 120, 122 in the housing 130.

The housing 130 is manufactured from a dielectric material, such as a plastic material. The housing 130 may be an injection molded part in various embodiments. The housing 130 includes a plurality of walls 150 forming cavities or chambers that receive various components of the electrical connector 100. The housing 130 extends between a front 152 and the rear 154. The housing 130 includes first and second sides 156, 158 extending between the front 152 and the rear 154. The housing 130 includes a top 160 and a bottom 162. The bottom 162 is configured to be mounted to the circuit board 106 (shown in FIG. 1). In an exemplary embodiment, the rear 154 is configured to face the radial lead electrical component 104 to receive the leads 110, 112 from the radial lead electrical component 104.

In an exemplary embodiment, the walls 150 of the housing 130 forming a positive contact chamber 170 and a negative contact chamber 172. The positive contact chamber 170 receives the positive contact 120 and the negative contact chamber 172 receives the negative contact 122. The housing 130 includes one or more of the walls 150 between the contact chambers 170, 172 to provide electrical isolation between the contacts 120, 122. In an exemplary embodiment, the contact chambers 170, 172 are open at the bottom 162 to receive the contacts 120, 122 through the bottom 162 of the housing 130. In an exemplary embodiment, the contact chambers 170, 172 are open at the top 160 to expose the contact beams 202 of the contacts 120, 122 for mating with the leads 110, 112. For example, the leads 110, 112 may be loaded into the sockets 244 from above, through the top 160 of the housing 130.

In an exemplary embodiment, the housing 130 includes a positive lead slot 174 and a negative lead slot 176 in a rear wall 155 of the housing 130 at the rear 154. The lead slots 174, 176 are aligned with the contact chambers 170, 172, respectively. The lead slots 174, 176 receive the leads 110, 112. The lead slots 174, 176 allow the leads 110, 112 to pass through the rear wall 155 from the radial lead electrical component 104. In an exemplary embodiment, the lead slots 174, 176 are aligned with the sockets 244 to position the leads 110, 112 for loading into the sockets 244. In an exemplary embodiment, the rear wall 155 may include guide surfaces 178 at the top 160 to guide the leads 110, 112 into the lead slots 174, 176.

During assembly, the cover 132 covers the contact chambers 170, 172 from above after the leads 110, 112 are loaded into the contact chambers 170, 172. In an exemplary embodiment, a front wall 153 of the housing 130 at the front 152 does not include the lead slots 174, 176, but rather blocks access to the contact chambers 170, 172. The front wall 153 blocks access to the contacts 120, 122 in the contact chambers 170, 172, such as to prevent inadvertent touching of the contacts 120, 122 and/or the leads 110, 112 and/or prevents dirt or debris from entering the contact chambers 170, 172 from the front 152. In an exemplary embodiment, the front wall 153 includes a keying feature 164, such as an opening, for keying and/or locating the housing 130, such as for mounting to the circuit board 106 or for mounting the radial lead electrical component 104 to the housing 130.

In an exemplary embodiment, the walls 150 of the housing 130 define latch pockets 180 that receive the latches 134, 136 to secure the cover 132 to the housing 130. The latch pockets 180 may be open at the top 160 to receive the latches 134, 136. In the illustrated embodiment, the latch pockets 180 are provided at the first and second sides 156, 158. Other locations are possible in alternative embodiments. In an exemplary embodiment, the housing 130 includes guide surfaces 178 at the top 160 extending into the latch pockets 180. The guide surfaces 178 may be angled the programs surfaces to guide the latches 134, 136 into the latch pockets 180. Optionally, multiple guide surfaces 178 may be provided for each latch pocket 180 to guide loading and multiple directions, such as front-to-rear and side-to-side. In an exemplary embodiment, the housing 130 includes a latch surface 184 for each latch pocket 180. The latches 134, 136 are configured to engage the latch surfaces 184 to retain the latches 134, 136 and the latch pockets 180. Other types of securing features may be used in alternative embodiments.

In an exemplary embodiment, the housing 130 includes solder tab pockets 190 that receives solder tabs 192 used to mechanically secure the electrical connector 100 to the circuit board 106. The solder tabs 182 may be soldered to corresponding solder pads on the circuit board 106 to provide mechanical retention of the electrical connector 100 relative to the circuit board 106 and relieve stress and strain on the solder interface between the contacts 120, 122 and the circuit board 106. In the illustrated embodiment, the solder tab pockets 190 are provided at the bottom 162 of the housing 130 at the front 152 and the rear 154. Other locations are possible in alternative embodiments. The in the illustrated embodiment, the solder tab pockets 190 are approximately centered between the first and second sides 156, 158; however, the solder tab pockets 190 may be provided at or near the first and second sides 156, the in alternative embodiments. The solder tabs 192 may be press-fit into the housing 130 to secure the solder tabs 182 in the solder tab pockets 190. The solder tabs 182 have bottom surfaces 194 configured to be soldered to the circuit board 106. The bottom surfaces 194 may be generally flush with the bottom 162 in various embodiments. However, the bottom surfaces 194 may protrude beyond the bottom 162 in alternative embodiments.

In an exemplary embodiment, the housing 130 includes air pockets 196 to reduce the amount of material used in performing the housing 130. The air pockets 196 may be located between the contact chambers 170, 172 to increase spacing between the first and second contacts 120, 122, such as to reduce arcing or electrical shorting between the contacts 120, 122.

Figure 8:
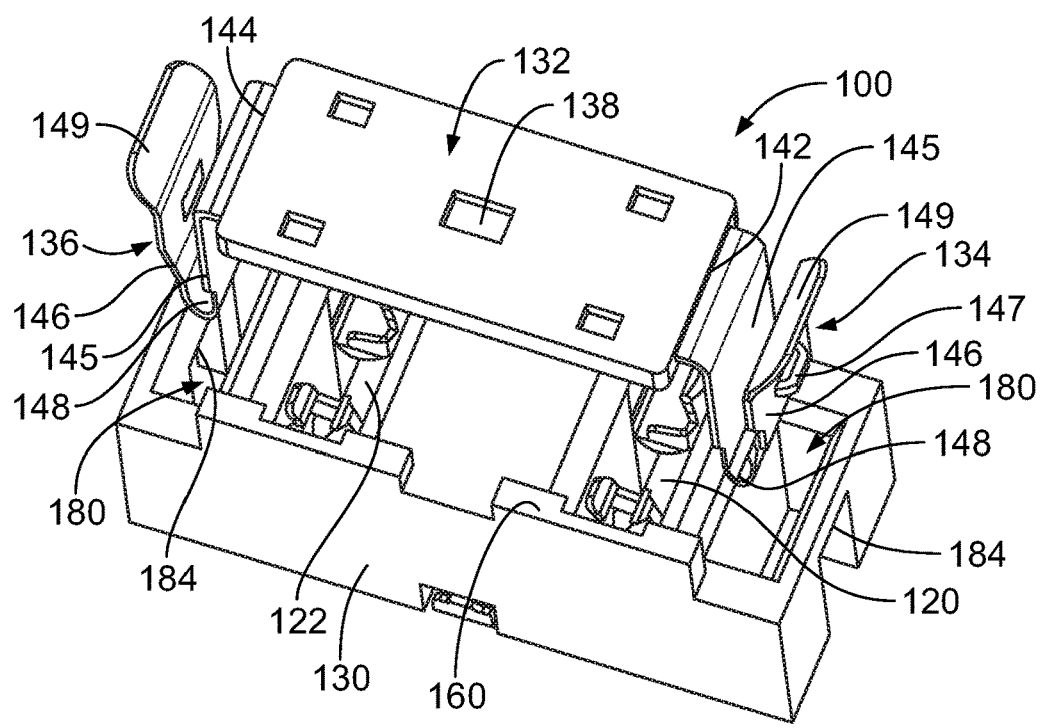
FIG. 8 is a top perspective view of the electrical connector in accordance with an exemplary embodiment showing a cover poised for coupling to a housing of the electrical connector.
Figure 9:
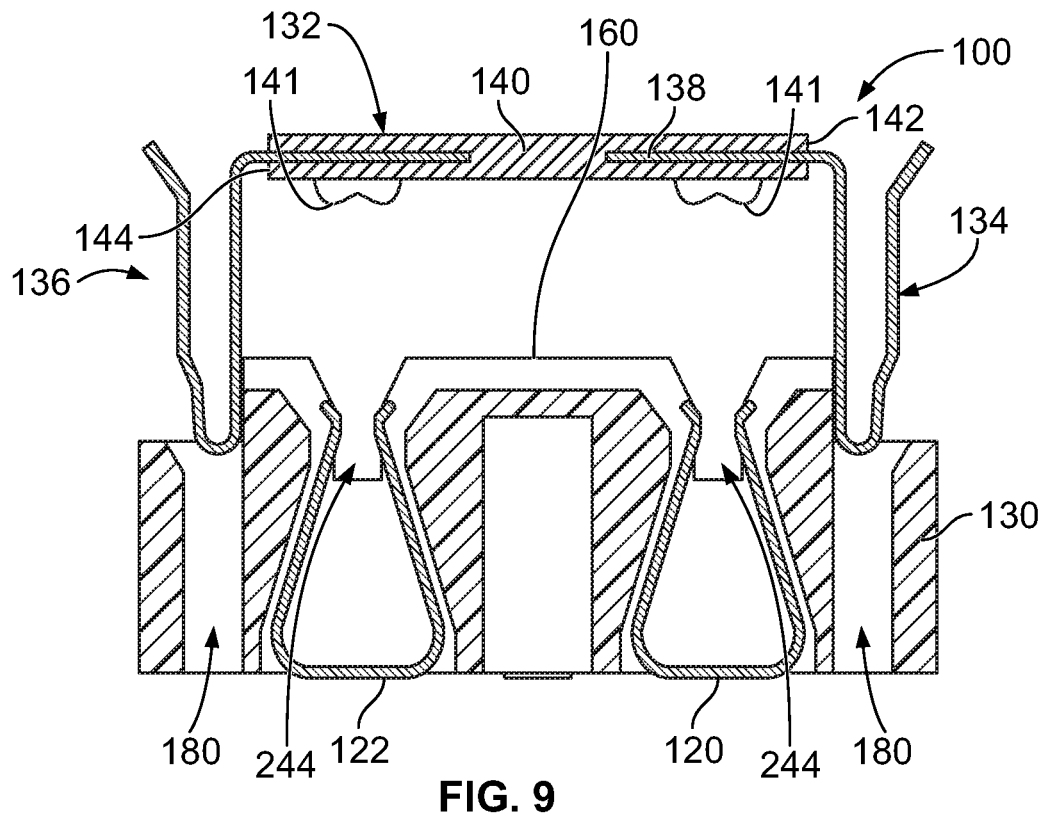
FIG. 9 is a cross-sectional view of the electrical connector showing the cover poised for coupling to the housing in accordance with an exemplary embodiment.

FIG. 8 is a top perspective view of the electrical connector 100 in accordance with an exemplary embodiment showing the cover 132 poised for coupling to the housing 130. FIG. 9 is a cross-sectional view of the electrical connector 100 showing the cover 132 poised for coupling to the housing 130.

The cover 132 includes a cover plate 140 used for covering the top 160 of the housing 130. The cover plate 140 extends between a first side 142 and a second side 144. The first latch 134 extends from the first side 142 and the second latch 136 extends from the second side 144. In an exemplary embodiment, the cover 132 includes a latch body 138 forming both the first latch 134 and the second latch 136. For example, the latch body 138 may be stamped and formed from a metal sheet such that the latch body 138 is continuous from the first latch 134 to the second latch 136 through the cover plate 140. For example, the cover plate 140 may be overmolded over a center section of the latch body 138 between the latches 134, 136.

In an exemplary embodiment, the cover 132 includes lead guide tabs 141 extending from a bottom surface of the cover plate 140. The lead guide tabs 141 are used to guide mating of the leads 110, 112 with the contacts 120, 122 in the housing 130 the lead guide tabs 141 are used to press the leads 110, 112 downward into the sockets 244. The lead guide tabs 141 may be used to retain the leads 110, 112 in the sockets 244, such as to prevent the leads 110, 112 from unloading from the sockets 244. The lead guide tabs 141 may have a concave shape to locate the lead 110, 112 and a side to side direction. For example, the lead guide tabs 141 may have angled surfaces that face inward to engage the leads 110, 112.

In an exemplary embodiment, each latch 134, 136 includes a first latch arm 145 and a second latch arm 146 extending from the first latch arm 145. The first latch arm 145 extends from the cover plate 140. The second latch arm 146 is deflectable relative to the first latch arm 145. The second latch arm 146 is configured to engage the housing 130 to secure the cover 132 to the housing 130. For example, the second latch arm 146 includes a latching finger 147 extending therefrom. The latching finger 147 is configured to engage the latch surface 184 in the latch pocket 180 to secure the latch 134, 136 in the latch pocket 180. In an exemplary embodiment, the second latch arm 146 is connected to the first latch arm 145 and a fold 148. The fold 148 may be U-shaped such that the second latch arm 146 is generally parallel to the first latch arm 145. The second latch arm 146 is located radially outward from the first latch arm 145. The second latch arm 146 is deflectable relative to the first latch arm 145, such as to release the latch 134, 136 from the housing 130. In an exemplary embodiment, the second latch arm 146 includes a release handle 149 extending therefrom. The release handle may be actuated by an operator, such as by squeezing inward on the release handle 149. Other types of latching features may be provided to secure the cover 132 to the housing 130 in alternative embodiments.

Figure 10:
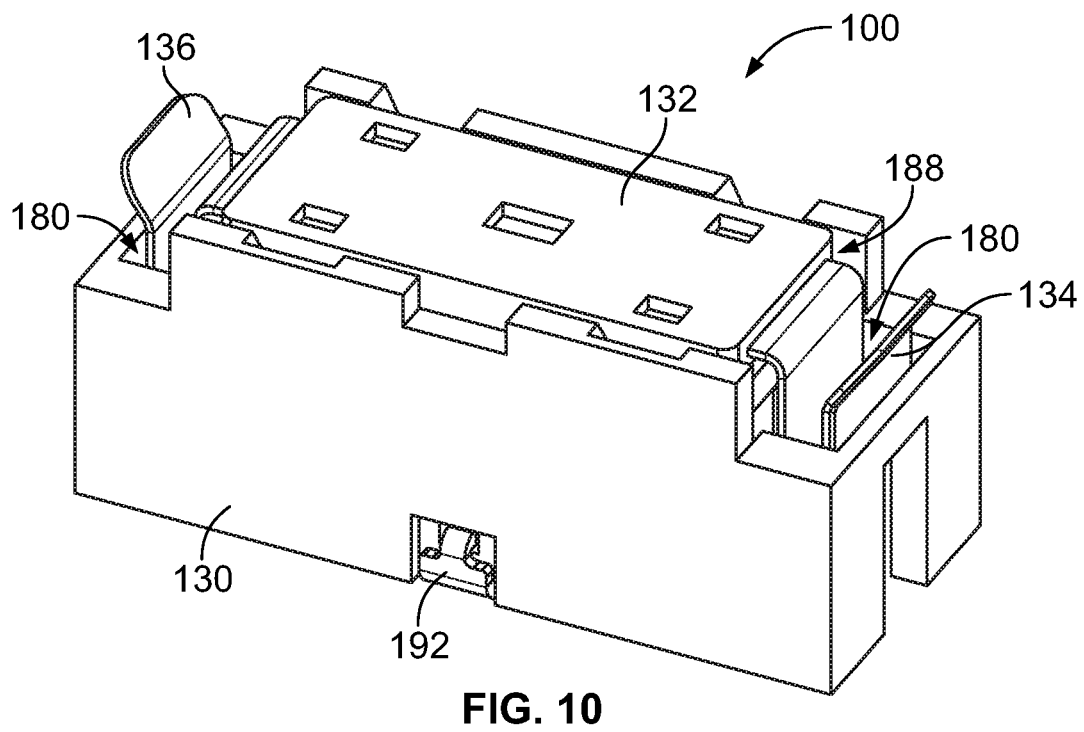
FIG. 10 is a front perspective view of the electrical connector in an assembled state in accordance with an exemplary embodiment.
Figure 11:
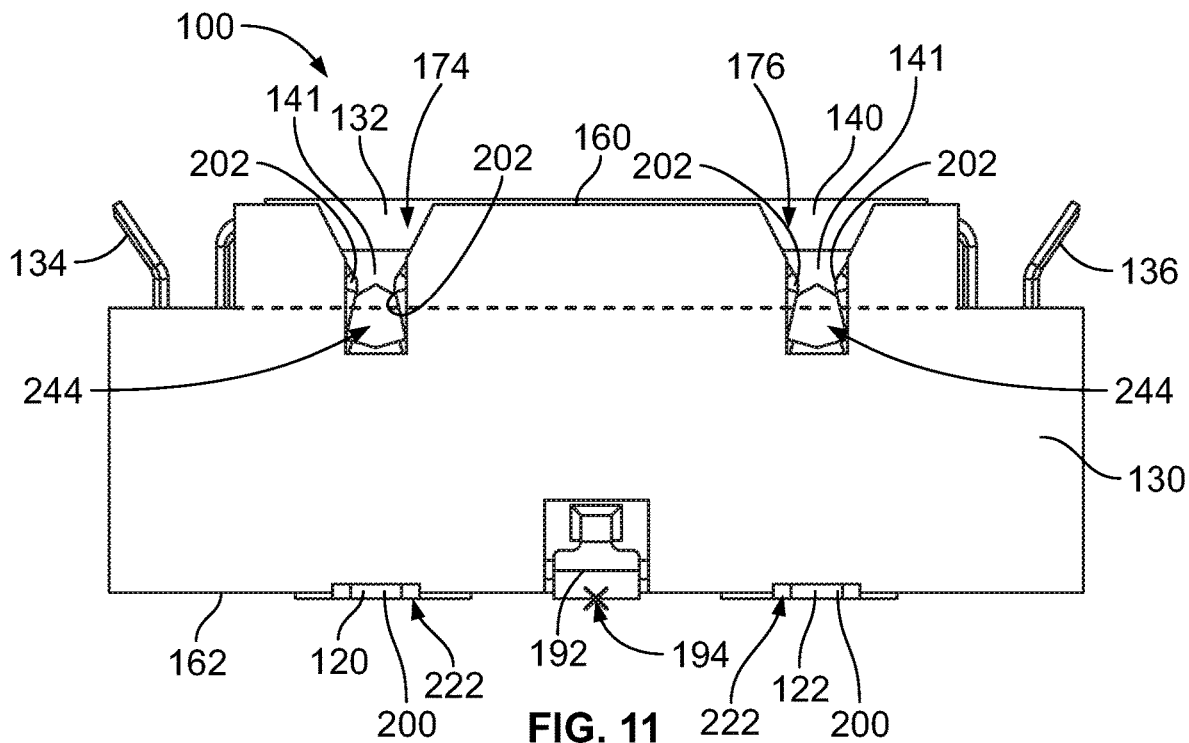
FIG. 11 is a rear view of the electrical connector in an assembled state in accordance with an exemplary embodiment.

FIG. 10 is a front perspective view of the electrical connector 100 in an assembled state. FIG. 11 is a rear view of the electrical connector 100 in an assembled state. FIGS. 10 and 11 illustrates the cover 132 coupled to the housing 130. The latches 134, 136 are received in the latch pockets 180 and secured to the housing 130.

In an exemplary embodiment, the cover 132 is received in a cover pocket 188 at the top 160 of the housing 130. As such, the cover plate 140 may be recessed at least partially into the housing 130. For example, a top of the cover plate 140 may be generally co-planer with the top 160 of the housing 130. In an exemplary embodiment, the lead guide tabs 141 extending from the bottom of the cover plate 140 are aligned with the lead slots 174, 176 and the contact beams 202 of the contacts 120, 122 to guide the leads 110, 112 into the sockets 244 of the contacts 120, 122.

As shown in FIG. 11, the contacts 120, 122 are coupled to the housing 130 such that the solder pads 222 at the base 200 of each of the contacts 120, 122 are provided at the bottom 162 of the housing 130. The solder pads 222 may stand proud of the bottom 162 (for example, slightly below the bottom 162) for mounting to the circuit board 106. The solder tabs 192 are positioned at the bottom 162 for mounting to the circuit board 106. The bottom surfaces 194 of the solder tabs 192 may be co-planer with the bottom surfaces of the solder pads 222.

Figure 12:
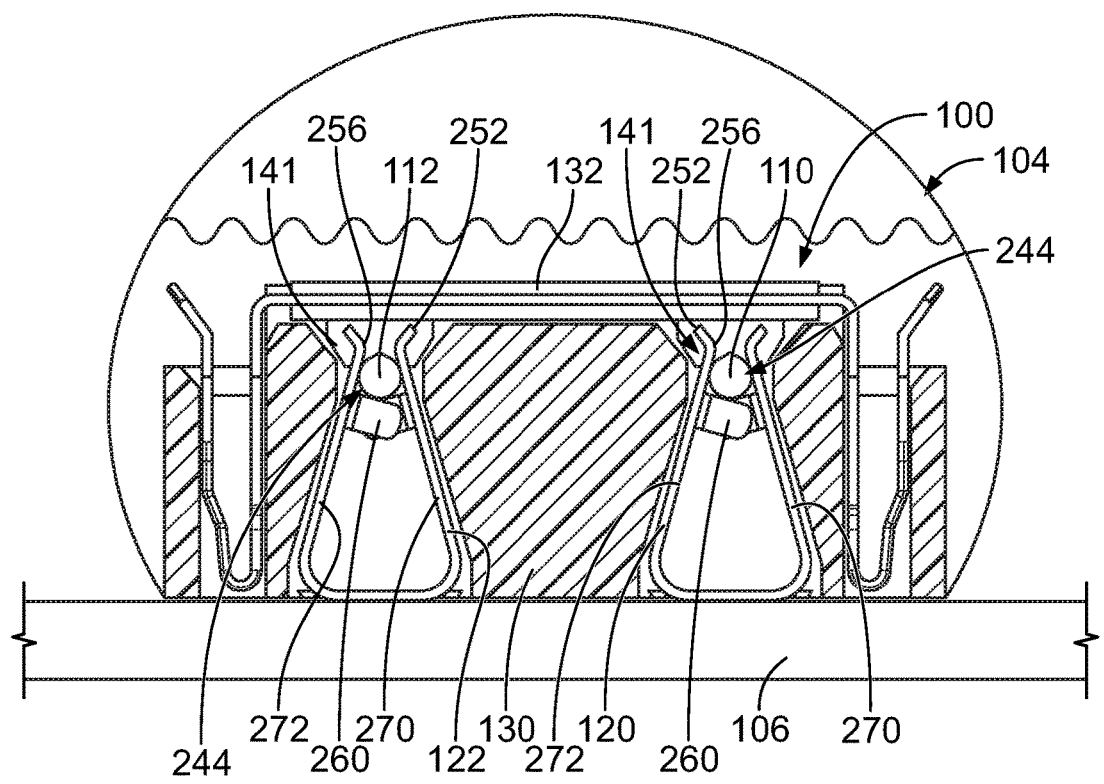
FIG. 12 is a cross-sectional view of the electrical connector in accordance with an exemplary embodiment.

FIG. 12 is a cross-sectional view of the electrical connector 100 coupled to the radial lead electrical component 104. During assembly, when the cover 132 is removed from the housing 130, the leads 110, 112 of the radial lead electrical component 104 may be loaded into the housing 130 from above. The leads 110, 112 are configured to be loaded into the sockets 244 between the distal ends 252 of the contact beams 270, 272. The leads 110, 112 may be loaded into the sockets 244 until the leads 110, 112 bottom out against the lead support tabs 260. As the leads 110, 112 are loaded between the contact beams 270, 272, the contact beams 270, 272 may be spread apart to allow the leads 110, 112 to pass between the knuckles 256 into the sockets 244.

Once the leads 110, 112 pass the knuckles 256, the distal ends 252 of the contact beams 270, 272 may be closed inward around and over the top of the leads 110, 112. As such, the leads 110, 112 are captured in the socket 244 between the knuckles 256 and the lead support tabs 260. The contacts 120 122 have multiple points of contact with the lead 110, 120.

When the cover 132 is coupled to the housing 130, the lead guide tabs 141 engage the leads 110, 112 from above. The lead guide tabs 141 may pressed downward against the leads 110, 112 to fully seat the leads 110, 112 against the lead support tabs 260. The lead guide tabs 141 preventive leads 110, 112 from backing out of the sockets 244.

The leads 110, 112 are electrically connected to the contacts 120, 122 at separable mating interfaces. The contact beams 270, 272 are electrically connected to the leads 110, 112 at solderless mating interfaces. As such, the radial the electrical component 104 may be removed and replaced, such as is damaged without requiring rework or soldering to the circuit board 106. The electrical connector 100 may remain mounted to the circuit board 106 when the radial the electrical component 104 is removed and replaced.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical connector comprising:
 a housing having walls forming contact chambers, the housing having a top and a bottom, the bottom configured to be mounted to a circuit board, the bottom having an opening, the walls of the housing including a front wall and a rear wall, the rear wall including lead slots open at the top to receive leads of an electrical component; and
 contacts received in corresponding contact chambers, each contact including a base provided at the bottom of the housing, the base having a solder pad at a bottom of the base received in the opening at the bottom of the housing and configured to be soldered to a circuit board conductor of the circuit board, each contact including contact beams extending from the base to form a socket proximate to the top of the housing, the socket configured to receive the lead of the electrical component from above to electrically connect to the lead of the electrical component, wherein the contacts define electrical paths between the leads and the circuit board.

2. The electrical connector of claim 1, wherein the contact beams are deflectable when the lead is loaded into the socket, the contact beams configured to be spring loaded against the lead to form a separable mating interface with the lead to electrically connect the lead with the circuit board.

3. The electrical connector of claim 1, wherein the contact beams are electrically connected to the lead at a solderless mating interface.

4. The electrical connector of claim 1, wherein the contact beams include a first contact beam extending from a first side of the base and a second contact beam extending from a second side of the base, the socket defined between the first contact beam and the second contact beam.

5. The electrical connector of claim 4, wherein the first contact beam is pitched toward the second contact beam non-perpendicular to the base and wherein the second contact beam is pitched toward the first contact beam non-perpendicular to the base.

6. The electrical connector of claim 4, wherein at least one of the first contact beam or the second contact beam includes a lead support tab extending therefrom defining a bottom of the socket to support the lead in the socket.

7. The electrical connector of claim 6, wherein the first contact beam includes a first knuckle at a distal end of the first contact beam and the second contact beam includes a second knuckle at the distal end of the second contact beam, the first knuckle, the second knuckle, and the support tab forming a cradle holding the lead and restricting movement of the lead relative to the contact.

8. The electrical connector of claim 1, wherein the contact beams include a first front contact beam extending from a first side of the base proximate to a front of the base, a first rear contact beam extending from the first side of the base proximate to a rear of the base, a second front contact beam extending from a second side of the base proximate to the front of the base and a second rear contact beam extending from the second side of the base proximate to the rear of the base, the lead captured between the first front contact beam and the second front contact beam and the lead being captured between the first rear contact beam and the second rear contact beam.

9. The electrical connector of claim 1, further comprising a cover coupled to the top of the housing to cover the contact chambers and the leads of the electrical component, the cover including latches received in latch pockets of the housing to secure the cover to the housing.

10. The electrical connector of claim 1, further comprising a cover coupled to the top of the housing to cover the contact chambers and the leads of the electrical component, the cover includes lead guide tabs configured to engage the leads of the electrical component to push the leads downward in the lead slots as the cover is coupled to the top of the housing.

11. The electrical connector of claim 1, further comprising a cover coupled to the top of the housing to cover the contact chambers and the leads of the electrical component, the cover includes a cover plate covering the top of the housing, the cover including a first latch extending from a first side of the cover plate coupled to a first side of the housing and the cover includes a second latch extending from a second side of the cover plate coupled to a second side of the housing.

12. The electrical connector of claim 11, wherein the cover includes a latch body stamped and formed from a metal sheet, the latch body defining the first latch and the second latch, the cover plate being overmolded over the latch body between the first latch and the second latch.

13. An electrical connector comprising:
a housing having walls forming a positive contact chamber and a negative contact chamber, the housing having a top and a bottom, the bottom configured to be mounted to a circuit board, the walls of the housing including a front wall and a rear wall, the rear wall including a positive lead slot open at the top and aligned with the positive contact chamber to receive a positive lead of the electrical component and a negative lead slot open at the top and aligned with the negative contact chamber to receive a negative lead of the electrical component;
a cover coupled to the top of the housing, the cover including lead guide tabs configured to engage the positive lead and the negative lead to push the positive lead downward into the positive lead slot and to push the negative lead downward in the negative lead slot as the cover is coupled to the top of the housing;
a positive contact received in the positive contact chamber, the positive contact including a positive base provided at the bottom of the housing, the positive base having a positive solder pad at a bottom of the positive base configured to be soldered to a positive circuit board conductor of the circuit board, the positive contact including positive contact beams extending from the positive base to form a positive socket proximate to the top of the housing, the positive socket configured to receive the positive lead of the electrical component from above to electrically connect to the positive lead of the electrical component; and
a negative contact received in the negative contact chamber, the negative contact including a negative base provided at the bottom of the housing, the negative base having a negative solder pad at a bottom of the negative base configured to be soldered to a negative circuit board conductor of the circuit board, the negative contact including negative contact beams extending from the negative base to form a negative socket proximate to the top of the housing, the negative socket configured to receive the negative lead of the electrical component from above to electrically connect to the negative lead of the electrical component.

14. The electrical connector of claim 13, wherein the positive contact beams form a separable mating interface with the positive lead to electrically connect the positive lead with the circuit board, and wherein the negative contact beams form a separable mating interface with the negative lead to electrically connect the negative lead with the circuit board.

15. The electrical connector of claim 13, wherein the positive contact beams include a first positive contact beam extending from a first side of the positive base and a second positive contact beam extending from a second side of the positive base, the positive socket defined between the first positive contact beam and the second positive contact beam, and wherein the negative contact beams include a first negative contact beam extending from a first side of the negative base and a second negative contact beam extending from a second side of the negative base, the negative socket defined between the first negative contact beam and the second negative contact beam.

16. The electrical connector of claim 15, wherein the first positive contact beam is pitched toward the second positive contact beam non-perpendicular to the positive base and wherein the second positive contact beam is pitched toward the first positive contact beam non-perpendicular to the positive base, and wherein the first negative contact beam is pitched toward the second negative contact beam non-perpendicular to the negative base and wherein the second negative contact beam is pitched toward the first negative contact beam non-perpendicular to the negative base.

17. The electrical connector of claim 15, wherein at least one of the first positive contact beam or the second positive contact beam includes a positive lead support tab extending therefrom defining a bottom of the positive socket to support the positive lead in the positive socket, and wherein at least one of the first negative contact beam or the second negative contact beam includes a negative lead support tab extending therefrom defining a bottom of the negative socket to support the negative lead in the negative socket.

18. The electrical connector of claim 13, wherein the cover includes a cover plate covering the top of the housing, the cover including a first latch extending from a first side of the cover plate coupled to a first side of the housing and the cover includes a second latch extending from a second side of the cover plate coupled to a second side of the housing.

19. A power circuit assembly comprising
a circuit board having board contacts on an upper surface of the circuit board;
a radial lead electrical component having radially extending leads extending from a first side of the radial lead electrical component; and
an electrical connector being surface mounted to the upper surface of the circuit board to electrically connect the leads of the radial lead electrical component to the board contacts of the circuit board, the electrical connector comprising:
a housing having walls forming contact chambers, the housing having a top and a bottom, the bottom configured to be mounted to a circuit board, the walls of the housing including a front wall and a rear wall, the rear wall including lead slots open at the top to receive leads of an electrical component;
a cover coupled to the top of the housing, the cover including lead guide tabs configured to engage the leads of the electrical component to push the leads downward in the lead slots as the cover is coupled to the top of the housing; and
contacts received in corresponding contact chambers, each contact including a base provided at the bottom of the housing, the base having a solder pad at a bottom of the base configured to be soldered to a circuit board conductor of the circuit board, each contact including contact beams extending from the base to form a socket proximate to the top of the housing, the socket configured to receive the lead of the electrical component from above to electrically connect to the lead of the electrical component.

20. The power circuit assembly of claim 19, wherein the radial lead electrical component includes a capacitor having a positive lead and a negative lead.

21. The power circuit assembly of claim 19, wherein the radial lead electrical component includes second leads at a second side, the power circuit assembly further comprising a second electrical connector being surface mounted to the upper surface of the circuit board to electrically connect the second leads of the radial lead electrical component to second board contacts of the circuit board, the second electrical connector being identical to the electrical connector.

* * * * *